United States Patent [19]

Hinkel

[11] 4,105,924
[45] Aug. 8, 1978

[54] APPARATUS FOR MAKING A RASTERED PHOTOCONDUCTIVE LAYER

[75] Inventor: Holger Hinkel, Boeblingen, Fed. Rep. of Germany

[73] Assignee: International Business Machines Corporation, Armonk, N.Y.

[21] Appl. No.: 741,083

[22] Filed: Nov. 11, 1976

[30] Foreign Application Priority Data

Dec. 20, 1975 [DE] Fed. Rep. of Germany ....... 2557685

[51] Int. Cl.² ............................................. H01J 37/00
[52] U.S. Cl. ................................ 250/492 A; 250/442
[58] Field of Search ................... 250/492 A, 398, 451, 250/452, 442

[56] References Cited

U.S. PATENT DOCUMENTS

| | | | |
|---|---|---|---|
| 3,246,147 | 4/1966 | Skala | 250/398 |
| 3,375,342 | 3/1968 | Robinson | 250/398 |
| 3,689,766 | 9/1972 | Freeman | 250/492 A |
| 3,778,626 | 12/1973 | Robertson | 250/492 A |
| 3,983,402 | 9/1976 | Arndt et al. | 250/492 A |

*Primary Examiner*—Alfred E. Smith
*Assistant Examiner*—B. C. Anderson
*Attorney, Agent, or Firm*—Joseph G. Walsh

[57] ABSTRACT

A method and apparatus for making a rastered photoconductive layer for electrophotography in order to achieve an improved representation of black areas. The raster is produced by means of ion implantation of substances altering the dark discharge speed.

3 Claims, 3 Drawing Figures

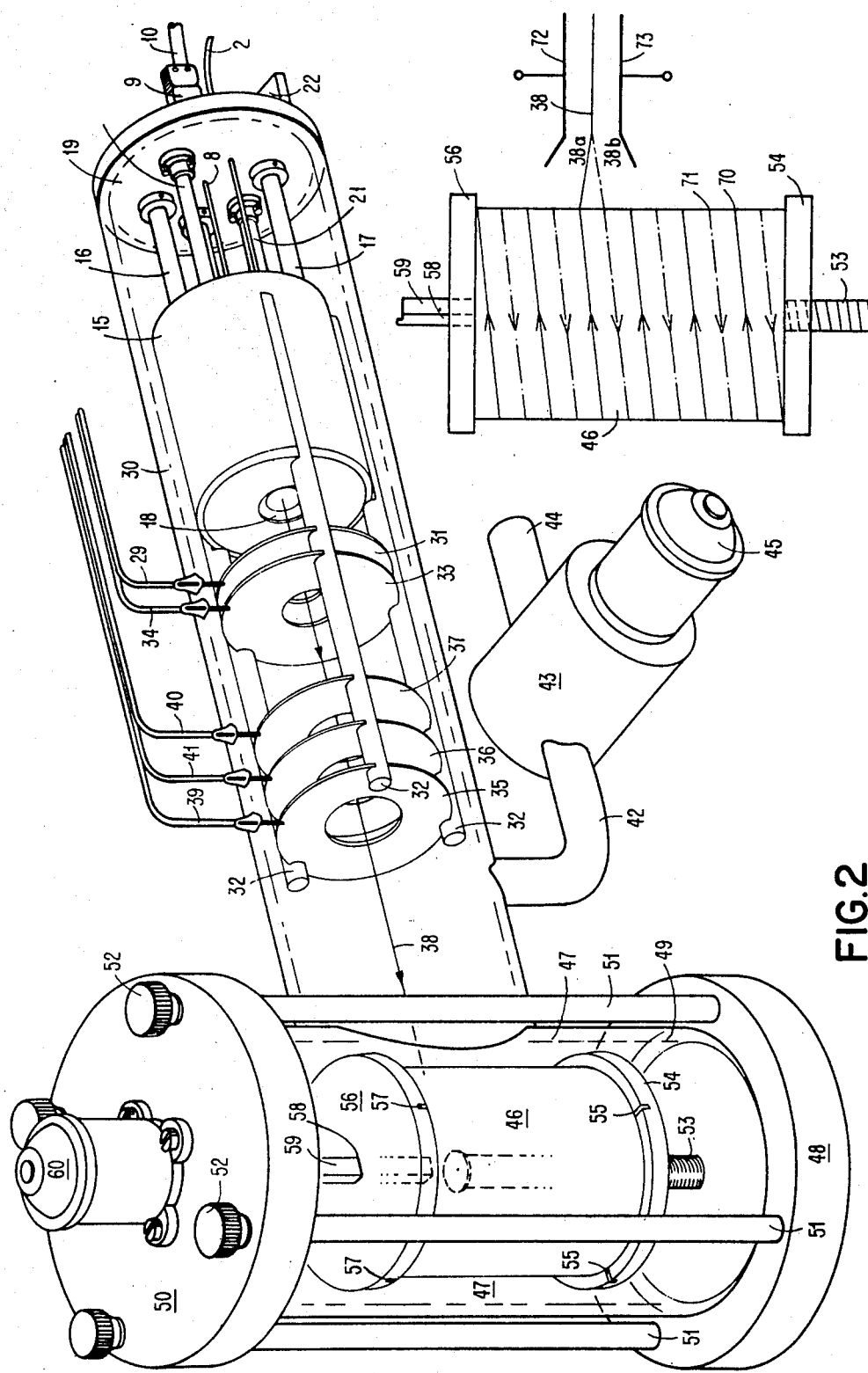

APPARATUS FOR MAKING A RASTERED PHOTOCONDUCTIVE LAYER

FIELD OF THE INVENTION

In electrophotographic copying, the image of black areas is not a true copy of the original. In the copy, only the area margins are black, whereas the inner zone remains substantially white. The charged image on the photoconductive surface remains for at least some time an approximately true copy of the original, but upon the application of the toner, it is not the charged image that is developed, but the image of the electric flux lines. Toner is applied on the photoconductive surface only in those places where flux lines emerge from the surface. In large and uniformly charged surfaces, this occurs only in marginal zones. Therefore, the copy is black only there. The present invention provides rastered photoconductive layers which help very much in eliminating this marginal effect.

PRIOR ART

For eliminating this disadvantage, it is known to place a transparent raster foil under the original for exposure. By means of providing a line or spot raster under the raster foil, white lines or spots are scattered over the black areas. It is thus ensured that from the charged image on the photoconductive layer there emanate flux lines not only from the marginal zones of the black area, but also from its interior. When this area is developed there consequently is a toner deposition also in the interior of the black area so that a uniformly dark area is achieved on the copy.

A manufacturing process for such a contact raster has heretofore been proposed in German Offenlegungsschrift No. 2409677, published Sept. 4 1975, entitled "Production Process For A Contact Raster Device For Its Realization"; Kassakow et al, where, by means of a cathode ray tube, light spots are produced on a photosensitive material. The raster is obtained by pulsing the cathode ray tube, and moving the photosensitive material and cathode ray tube relative to each other.

Raster foils have serious disadvantages. They are complicated to handle because the foil has to be inserted together with the original. Specific problems can appear in connection with devices pulling in the original, because a simultaneous transport of two superimposed sheets is not certain. Finally, the raster is relatively coarse and therefore clearly visible on the copy.

Less complicated in their operation are those devices where a raster is inserted into the photoconductive layer itself. From IBM Technical Disclosure Bulletin, Vol. 9, No. 11, April 1967, p. 1529, it is known to etch raster-like arranged holes into the photoconductor carrier, to fill them with dielectric material, and to place the photoconductive layer thereupon. However, this raster is very coarse, too, and therefore clearly visible on the copy. Besides, the influence on the charge carrier injection from the substrate is less effective than from the surface.

According to another process heretofore proposed for rastering a photoconductive layer, the electrophotographic layer has to have admixed thereto other substances apart from the photoconductive substance, which have, at most, the same granular size as the photoconductor. In this process, a fine rastering can be achieved. For the rastering of selenium layers to be vapor-deposited, however, this process is not suitable as the mixtures proposed for this process are not vapor-depositable.

Still another electrophotographic recording material with a rastered photoconductive selenium layer is described in the prior art. For making the raster in the selenium layer, small zones of crystalline selenium are generated by a pulse laser beam in the otherwise amorphous selenium layer. This process does not appear suitable for practical use since when making a photoconductive layer of selenium, efforts are made not to permit the forming of crystalline selenium zones as it is known that such crystalline zones increase and result in visible defect areas on the copy. Owing to the high electric conductivity, crystalline zones act like exposed zones of amorphous selenium.

SUMMARY OF THE INVENTION

It is the object of the present invention to provide a process of making rastered photoconductive layers showing a fine rastering which does not have a disturbing effect on the copy, and which shows a high degree of influence in the elimination of the marginal effect. This raster can also be applied supplementarily on the already completely photoconductive layer.

This process of making a rastered photoconductive layer for electrophotography in order to achieve an improved representation of black areas is characterized in that the raster is made by means of ion implantation in substances which alter the dark discharge speed.

Below, the process as disclosed by the invention will be explained in detail by means of the embodiments shown in the Figures.

FIG. 2 shows in a perspective view an embodiment for a device as disclosed by the invention for ion implantation of a drum coated with a photoconductor (photoconductor drum).

FIG. 3 represents the course of a line raster on a photoconductor drum, and it shows how such line raster can be made.

Figure 1:
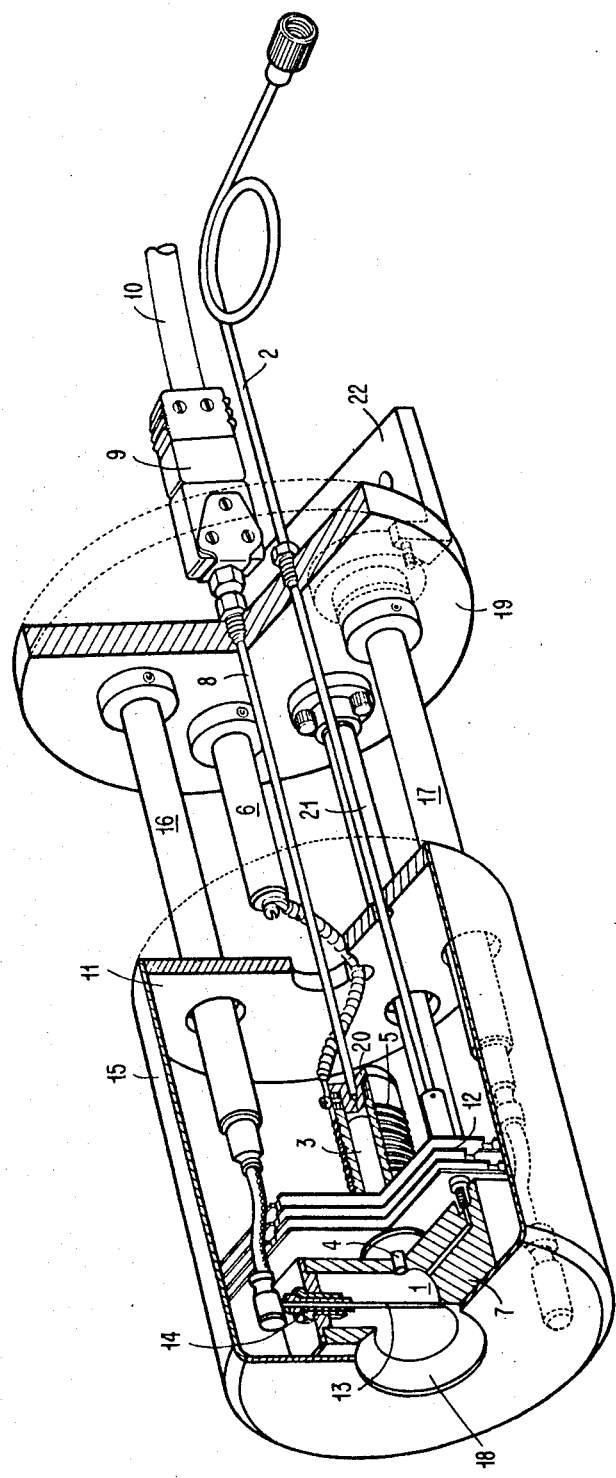
FIG. 1 shows a partly sectional view of an embodiment for an ion source.

In FIG. 1, the ionization chamber where the ions are generated is marked 1. The material to be ionized is inserted in ionization chamber 1 in gaseous form. If this material is already in its gaseous form at room temperature, the supply takes place via a pipeline 2. If the material to be ionized is a material that is solid at room temperature, e.g. arsenic, it has to be evaporated in an evaporation chamber 3, and introduced into ionization chamber 1 via ionization chamber outlet 4. Onto the lateral area of evaporation chamber 3 which is cylindrical in the present case, a heating coil 5 is wound. One connection of heating coil 5 is made via voltage supply 6, the other connection of heating coil 5 is joined to the casing of the evaporation chamber, which casing in turn has a galvanic connection to the casing wall 7 of ionization chamber 1 which, as will be explained below, is to be applied to a voltage of e.g. +20 kV. The voltage on voltage supply line 6 would then be e.g. 20 kV - 50 V, so that at heating coil 5, there would be a voltage difference of 50 V. The back of evaporation chamber 3 is closed by a cover 20 which for the charging of evaporation chamber 3 can be unscrewed. In cover 20, a thermal element is fastened by means of which the temperature of evaporation chamber 3 can be controlled. Via a plug 9 and a line 10, thermal element 8 is connected to a measuring instrument not shown here. Between evaporation chamber 3 and ionization chamber 1, four heat screens 12 are provided.

Ionization chamber 1, heat screens 12, and the evaporation chamber 3 are surrounded by a screening unit 15 which, at its back, is close by a back wall 11. For charging evaporation chamber 3, screening unit 15 and back wall 11 can be shifted forward so that cover 20 is accessible.

Through ionization chamber 1, there passes a thermionic cathode 13 which by means of insulated current leads 14 is guided through casing wall 7 of ionization chamber 1. As already mentioned above, +20 kV is applied to casing wall 7 of the ionization chamber. Thus, the parts connected to ionization chamber 1, e.g. screening unit 15, evaporation chamber 3, back wall 11, and heat screens 12, are connected to +20 kV, too. The voltage difference between therminonic cathode 13 and casing wall 7 of ionization chamber 1 is roughly 100 V, and the voltage drop at thermionic cathode 13 is 3 V. In order to achieve these voltage ratios, a voltage of 20 kV - 103 V is applied via a voltage supply 16 for thermionic cathode 13, and via a voltage supply 17 for the other end of thermionic cathode 13, a voltage of 20 kV - 100 V is applied. Between therminoic cathode 13 and casing wall 7 of ionization chamber 1, there is consequently an arc discharge by means of which the atoms or molecules of the gas in ionization chamber 1 are ionized, and can be electrically removed by suction via a window 18.

Voltage supplies 6, 16, and 17 are fixed in a circular vacuum flange 19 in such a manner that they protrude without contact through holes in the backwall of screening unit 15. For fixing the relative position of vacuum flange 19 and the parts housed in screening unit 15, two supports 21 are provided which are screwed to casing wall 7 of ionization chamber 1, as well as to vacuum flange 19. In the representation of FIG. 1, one of these supports 21 is not visible, owing to the sectional view. Screwed to vacuum flange 19, a mounting plate 22 is provided by means of which the ion source can be suspended, for instance, in a frame.

FIG. 2 shows an embodiment for a device for ion implantation of the photoconductive lateral area of a photoconductor drum. A horizontal glass tube 30 contains the entire ion beam generation system. At the right-hand end of glass tube 30, there is the ion source described by FIG. 1, whose parts, as far as they are visible, have been given the same reference numbers as in FIG. 1. The right-hand end of glass tube 30 is closed by vacuum flange 19 which, by means of the vacuum inside, glass tube 30 is pressed impermeably to gas against the end of glass tube 30. Between vacuum flange 19 and glass tube 30, a seal can be inserted. At the inner wall of glass tube 30, three ceramic rods 32 are placed against said wall which, within the ion source area, show milled notches for supporting screening unit 15. Another function of ceramic rods 32 consists in holding several plates arranged in front of window 18 of the ion source. For this purpose, ceramic rods 32 show recesses into which engage the edges of the plates. The first plate seen from the ion source is the so-called extraction electrode 31 which has the function to withdraw the ions from the ion source. In the present embodiment, it is assumed that the ion source emits arsenic ions which have a positive charge. Here, the extraction electrode 31 is applied to a potential of −1 kV which compared with the potential of the ion source of +20 kV is strongly negative and which is supplied via line 29. The next electrode 33 is applied to ground potential which is applied via line 34. It is the object of the electric field between electrode 33 and electrode 31 to prevent electrons that may be generated by the ion beam and which move in opposite direction to the ions, from being accelerated into the ion source and generating an undesired X-radiation there. The following three plates with apertures 35, 36, and 37 form together a focusing lens that has the function to focus ion beam 38 in such a manner that it impinges in a spot-like manner on its aim. Such focusing lenses are known. In the present embodiment, outer plates 35 and 37 are applied to ground. This potential is applied via lines 39 and 40. The middle one of these plates 36 is applied to a higher potential, in the present example of +2 kV. This voltage is applied via line 41.

Fused to glass tube 30, an air suction tube 42 is provided via which, by means of a vacuum pump 43, a vacuum is generated in the ion implantation device. The withdrawn air exits to the outside via an outlet socket 44. For driving vacuum pump 43, an electric motor 45 is provided. For driving vacuum pump 43, an electric motor 45 is provided. Vacuum pump serves, in the first place, for emptying the device and then remains switched in to maintain the vacuum.

The parts of the device to be described below for the ion implantation on the photoconductor surface of a drum incite the photoconductor drum marked 46 here, into rotation, and simultaneously move it in axial direction so that ion beam 38, which impinges spot-like on the lateral area of the photoconductor drum, generates a spiral-like line raster there. Photoconductor drum 46 and the parts required for moving it are connected to ground potential.

In the present embodiment, it is assumed that the photoconductor layer consists of amorphous selenium, and that arsenic ions are implanted in the selenium layer. With respect to the structure of amorphous seleneium, there exist several theories; some authors assume that amorphous selenium consists of irregular chains of selenium atoms, and other authors ascribe to amorphous selenium in the form of annular molecules, whereas others mean that amorphous selenium consists of both, i.e. chain and annular structures. Be that as it may, the positively charged arsenic ions applied onto the selenium layer by ion implantation have to place themselves against some of the free valencies of the selenium. In the areas where arsenic is deposited, the dark discharge speed is increased, so that this area loses its charge more quickly and consequently, upon development with toner material, will have a charge differing from that of its surroundings that have been exposed with the same intensity. With these arsenic-doped rasters, therefore, an effect is achieved in the selenium layer as if for exposure, an extremely fine raster foil had been introduced in the light beam. By means of ion implantation, it is, for instance, possible to produce rasters with 100 lines per cm. Spot rasters of corresponding fineness can also be produced in accordance with the invention, but when the ion beam has to be periodically interrupted, e.g. with a rotating shutter.

A photoconductor drum 46 is arranged in a glass cylinder 47. Glass cylinder 47 stands in a vertical position and is fused to glass tube 30 in the middle of glass cylinder 47. Glass cylinder 47 is vacuum sealed by a metallic base plate 48 in downward direction. For the vacuum-sealed connection of both parts, a putty stripe 49 is provided.

The upper opening of glass cylinder 47 is similarly sealed with a metallic head plate 50. For inserting the photoconductor drum 46, and for removing it after the ion implantation, head plate 50 can be removed and vacuum-sealed with respect to glass cylinder 47 by means of a rubber seal not shown in this figure. Head plate 50 is guided through four supports 51 fixed in base plate 48. At their upper ends, supports 51 have screw threads protruding through holes into head plate 50. By means of screws 52, head plate 50 is pulled downward in such a manner that it vacuum seals glass cylinder 47 by means of the rubber seal.

In the axis of symmetry of base plate 48, an elevating spindle 53 protruding into the interior of glass cylinder 49 and having a fine thread is arranged. A corresponding thread moving in elevating spindle 53 is provided in a lower socket 54 for the photoconductor drum. In order to prevent a rotation of photoconductor drum 46 with respect to lower socket 54, wedges 55 are inserted in milled notches of lower socket 54 which protrude to the interior to such an extent that they engage in corresponding grooves at the edge of photoconductor drum 46. A corresponding upper socket 56 fixes the upper edge of photoconductor drum 46. Here, too, wedges 57 are engaged in corresponding grooves, said wedges preventing upper socket 56 and photoconductor drum 46 from rotating against each other. In the center of upper socket 56, a square guide 58 is provided which can move along a square driving shaft 59.

Square driving shaft 59 is guided through a gas-impermeable passage through head plate 50, and is rotated by means of a driving motor 60 fixed to head plate 50.

Rotating square driving shaft 59 rotates via guide 58, upper socket 56, and thus, photoconductor drum 46. Consequently, lower socket 54 is made to rotate, too, and since the latter moves on elevating spindle 53, it initiates a lifting or lowering motion of photoconductor drum 46, depending on the rotational direction of square driving shaft 59.

Elevating spindle 53 is preferably slightly enlarged at its upper end so that lower socket 54 cannot be removed from the spindle. Upon the insertion of a new photoconductor drum, lower socket 54 is preferably at the upper end of elevating spindle 53. First, photoconductor drum 46 is placed onto the lower socket, in such a manner that wedges 55 prevent a rotation of photoconductor drum against lower socket 54. Subsequently, upper socket 56 and head plate 50 are inserted. Then, after the mounting on supports 51, head plate 50 is screwed tight by means of screws 52, and thus glass cylinder 47 closed toward the upper part. When motor 60 is switched in, in such a manner that square driving shaft 59 rotates clockwise, photoconductor drum 46 moves slowly downward, and the point of impingement of ion beam 38 generates on the lateral surface of photoconductive drum 46, a spiral-shaped doping track. After photoconductor drum has been completely moved downward, i.e. when the point of impingement of ion beam 38 has reached the upper edge of photoconductor drum 46, the ion beam is interrupted. The recording of such a line raster on a lateral area of 2000 cm$^2$, which approximately corresponds to a photoconductor drum with a radius of 10 cm and 30 cm height, takes about 5 minutes when an ion dosis of approx. $10^{12}$ cm$^{-2}$ is to be reached and an ion current of approx. 1 μA is used.

After photoconductor drum 46 has reached its lower position and the ion beam has been interrupted, motor 60 is switched in such a manner that it moves square driving shaft 59 at high speed counterclockwise so that photoconductor drum 46 is re-transported to the top very quickly and can be removed from glass cylinder 47 after head plate 50 has been screwed off.

Another way of operating the device in accordance with FIG. 2, and of the line raster generation on photoconductor drum 46 will be demonstrated by FIG. 3 which in a lateral view shows photoconductor drum 46 and the driving parts used for driving photoconductor drum 46. In the embodiment of FIG. 3, it is assumed that the lines of the line raster are generated both upon a lowering motion of the photoconductor drum, and upon a subsequent lifting motion of the drum. It is assumed there that the drum is inserted as described in connection with FIG. 2 when lower socket 54 is at the upper end of elevating spindle 53. During the subsequent lowering motion of photoconductor drum 46, spiral-shaped track 70 drawn in continuous lines is shown on photoconductor drum 46. After photoconductor drum 46 has reached its lowest position, it is rotated in opposite direction, and by the thus carried out lifting process, a second spiral-shaped track 71 shown in dash-dotted representation and placed between the coils of track 70 is generated. The shifting of the two tracks is produced by deflecting ion beam 38 which by means of standard deflection means, e.g. the electrostatic plates 72 and 73 shown here, is deflected once in upward direction in path 38a, and once in downward direction in path 38b.

For better understanding, FIG. 2 shows only one vacuum pump 43 for generating and maintaining the vacuum. For practical usage, it may be of advantage to use a specific vacuum pump in the ion source area, which in the ion chamber generates, for instance, a vacuum of $10^{-2}$ Torr, whereas in the ion beam area by vacuum pump 43, a vacuum of $10^{-5}$ Torr could be generated.

So as to avoid having to regenerate, after the exchange of the photoconductor drum 46, the vacuum in all vessels of the arrangement of FIG. 2, it is possible to install in the border area between glass tube 30 and glass cylinder 47, a high vacuum valve known per se, e.g. a slide valve for separating the two cavities. For evacuating the glass cylinder containing the photoconductor drum, another vacuum pump with a suction tube opening, e.g. in base plate 48, has to be provided.

In the present embodiment, the ion implantation of arsenic ions in selenium has been described. Instead of selenium, other photoconductors can be used, and instead of arsenic, other doping materials altering the dark discharge speed of the photoconductor can be employed, e.g. tellurium.

What is claimed is:

1. Apparatus for providing a rastered photoconductive layer on a selenium-coated photoconductor drum for achieving an improved representation of black areas, said apparatus comprising
    housing means including a transparent vacuum-sealed cylinder that has an axial length substantially longer than that of the drum,
    spindle means carried by said housing means and extending coaxially into the cylinder and into screw-threaded engagement with said drum,
    an ion implantation device mounted to project an ion beam of arsenic to impinge on the periphery of the drum and implant arsenic in the selenium coating, and means for selectively rotating the drum to cause it to move axially relative to the cylinder while the ion beam is generated by said implantation device, thereby to produce at least one spiral-shaped raster track on the photoconductive layer, each such track being constituted by uniformly spaced convolutions, wherein the convolutions defining one of the spiral-shaped tracks are uniformly spaced a preselected distance apart during axial movement of the drum in one direction and the convolutions defining another spiral-shaped track are disposed between the convolutions of said one track and uniformly spaced said preselected distance apart during movement of the drum in the opposite direction.

2. Apparatus according to claim 1, including means for periodically interrupting the ion beam projected by said implantation device, thereby to generate a spot raster.

3. Apparatus as claimed in claim 1, characterized in that the implantation device is a thermionic cathode ion beam source.

* * * * *